United States Patent [19]

Curtice

[11] 3,996,529
[45] Dec. 7, 1976

[54] VARACTOR TUNING APPARATUS FOR A STRIP TRANSMISSION LINE DEVICE

[75] Inventor: Walter Richard Curtice, Princeton Junction, N.J.

[73] Assignee: RCA Corporation, New York, N.Y.

[22] Filed: May 22, 1975

[21] Appl. No.: 579,970

[52] U.S. Cl. .................................. 331/99; 330/5; 330/34; 330/53; 331/107 R; 331/107 G; 331/177 V; 333/82 R; 333/84 M; 334/45

[51] Int. Cl.² ..................... H03B 7/14; H03F 3/04; H01P 7/00; H03H 5/12

[58] Field of Search ................. 330/4.9, 5, 34, 53; 331/96, 99, 107 R, 107 G, 177 V; 334/15, 41, 45; 333/82 R, 82 B

[56] References Cited
UNITED STATES PATENTS 3,512,105   5/1970   Lance, Jr.; et al. ................. 31/96
3,599,118   8/1971   Large ........................ 331/177 V X
3,868,594   2/1975   Cornwell et al. .................... 331/99

*Primary Examiner*—Paul L. Gensler
*Attorney, Agent, or Firm*—Edward J. Norton; Joseph D. Lazar; Robert M. Rodrick

[57] ABSTRACT

A varactor tuning apparatus for tuning a strip transmission line radio frequency device, wherein the device having predetermined operating characteristics includes an active element such as an avalanche diode and a resonant conductive strip section. The tuning apparatus comprises a separate varactor circuit having a varactor mounted on a dielectric substrate including a resonant conductive strip. The varactor circuit is RF coupled to the strip transmission line of the device to provide for tuning the device by varying the reactance of the strip transmission line by electrically changing the capacitance of the varactor.

17 Claims, 6 Drawing Figures

VARACTOR TUNING APPARATUS FOR A STRIP TRANSMISSION LINE DEVICE

The invention herein described was made in the course of or under a contract or subcontract thereunder with the Department of the Air Force.

BACKGROUND OF THE INVENTION

1. Field of the Invention

This invention relates to a varactor tuning apparatus for a strip transmission line device and more particularly to an apparatus for tuning a device having a biased active element in a strip transmission line by electrically varying varactor capacitance in an independent varactor circuit RF coupled to the strip transmission line of the device.

2. Description of the Prior Art

In oscillators and other electronic devices which utilize strip transmission lines, it is often required to tune such devices to various different frequencies within a certain frequency range of intended operation. The term strip transmission line refers to that form of open transmission line which includes a substrate of dielectric material with a narrow conductive strip and a substantially wider ground conductor disposed on the substrate. The strip transmission line may be in either (i) the asymmetrical configuration, called a "microstrip," using a single ground plane on one side of the substrate and a narrow conductive strip on the opposite side of the substrate, (ii) the symmetrical configuration, commonly called a "stripline," having two ground planes on opposite sides of a narrow conductive strip, each ground plane being spaced from the narrow strip by a dielectric layer, or (iii) a surface strip transmission line configuration described by C. P. Wen in the IEEE 1969 G-MTT (Group on Microwave Theory and Techniques) International Microwave Symposium Digest, May 1969, under the title of "A Surface Strip Transmission Line for Nonreciprocal Gyromagnetic Device Applications." In the surface strip transmission line configuration, the narrow conductor is spaced a short distance from the wider conductor and both are on the same surface of the dielectric substrate. The tuning of the device to the desired frequencies has been achieved in many prior art devices by mechanical means. Such means function to change the capacitance in a circuit by varying the lengths or areas of capacitive materials or by adjusting the electromagnetic field configuration by means of insertion screws or sliding materials, the change in capacitance and field configuration varying the circuit resonance and thereby tuning the device. One problem with this type of tuning arrangement which depends on mechanical adjustments is the time required to effect the change of frequency. This is a disadvantage in that the mechanical adjustment of the frequency response is considerably time-consuming for applications requiring relatively fast reactions such as in microwave applications where rapid frequency changes are essential for operation of many electronic devices.

Some prior art devices incorporating strip transmission lines use a varactor (voltage variable capacitor) within the circuit itself to change the frequency of operation by varying the varactor capacitance electrically through bias voltage changes. In particular, this type of tuning arrangement has been satisfactory in devices in which a d.c. (direct current) bias is applied to the active elements in the circuit, even in such circuits in which the tuning varactor being included in the circuit itself results in substantial degradation of circuit performance.

However, in many strip transmission line devices having pulsed bias active elements, including oscillators and amplifiers in which a varactor is utilized to frequency tune and phase tune such devices, respectively, certain performance and tuning difficulties have been encountered. The inclusion of a varactor directly into the circuit has tended to significantly degrade the output efficiency and other operating characteristics of pulse-biased devices used in the radio frequency (RF) range, and in particular the microwave region, and the tuning capability has been generally poor.

More specifically, the operating characteristics that are of concern in the application of the present invention include: (1) the RF output power of the device; (2) the bias power to RF power conversion efficiency; (3) the signal-to-noise ratio of the RF output signal; and (4) the quality of the RF spectrum of the output power as compared with the ideal pulsed RF spectrum. A poor quality output, for example, would include an asymmetrical RF spectrum and a spectral display that does not correspond to the ideal $$\frac{\sin x}{x}$$

envelope expected from a pulsed RF source. These characteristics shall be identified herein as "the operating characteristics" of the device.

Poor operating characteristics of some of the prior art devices utilizing varactor tuning arrangements are the result of the varactor being an integral part of the circuit as by connecting directly the varactor to the strip transmission line. As the varactor capacitance in such arrangements is varied to achieve circuit tuning, the operating characteristics of the device also change. Therefore, these prior art varactor tuning means are not suitable, in particular, for pulsed applications.

SUMMARY OF THE INVENTION

According to the present invention, a varactor tuning apparatus is provided for tuning a negative-resistance radio frequency (RF) device having predetermined operating characteristics. The device is formed of a strip transmission line including an active solid-state element and a resonant section. The tuning apparatus comprises a varactor circuit including a varactor mounted on a dielectric substrate having a ground plane and a resonant conductive strip. The varactor circuit is RF coupled to the strip transmission line of the device. The tuning apparatus includes means for tuning the device by electrically varying the capacitance of the varactor circuit which changes thereby the reactance of the strip transmission line of the device.

DETAILED DESCRIPTION OF THE PREFERRED EMBODIMENT

The present invention is useful in electronic devices and circuits operating in the microwave region, particularly at Gigahertz frequencies. Such circuits may be implemented in the environment of open transmission lines of the so-called "strip transmission line" configuration, as described previously.

In general, the present invention is directed to a negative resistance device incorporating improved tuning means whereby the device includes a strip transmission line and an active solid-state element mounted therein. The preferred embodiment of the invention, now to be described, contemplates an oscillator in a microstrip transmission line. It is to be understood as well-known in the art that an amplifier can be also constructed with the same components as the oscillator, the type of operation depending upon the design of the circuit and the biasing of the active element.

Figure 1:
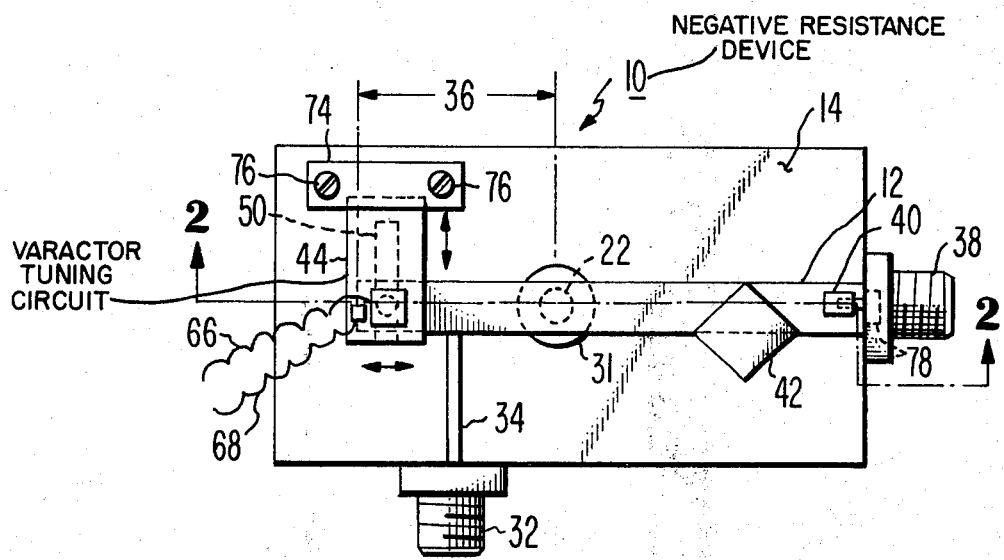
FIG. 1 is a plan view of an oscillator and a varactor tuning circuit in accordance with a preferred embodiment of the invention.
Figure 2:
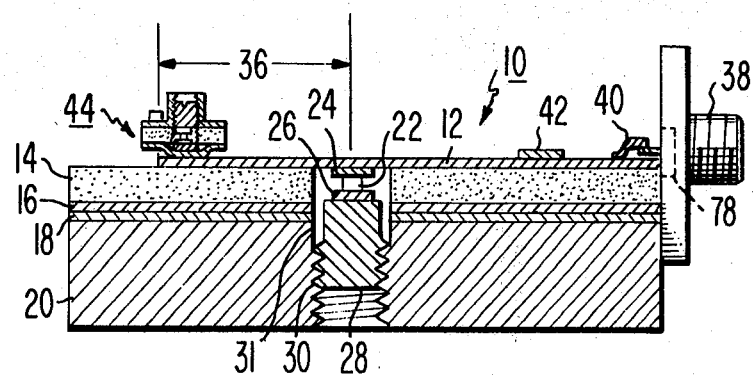
FIG. 2 is a sectional view of the oscillator and varactor tuning circuit as seen along viewing line 2—2 of FIG. 1.

Referring now to FIGS. 1 and 2, there is shown by way of example a negative resistance device 10 incorporating an oscillator circuit in a microstrip transmission line configuration. Device 10 comprises a dielectric substrate 14 having a conductive ground plane 16 covering one broad surface and a narrow conductive strip 12 on the other surface. The strip 12, dielectric substrate 14 and ground plane 16 form the microstrip transmission line. Ground plane 16 is affixed to a copper heat sink block 20 by a metallic solder bond 18.

An aperture 31 is formed through block 20, bond 18, ground 16, and substrate 14 in register with conductive strip 12 to provide for mounting an active solid-state element 22 in strip 12. Active element 22 may be a suitable negative resistance element such as an avalanche diode, or a transferred electron device. Lower terminal 26 of active element 22 is conductively affixed to a thermally and electrically conductive pedestal 28. Pedestal 28 is externally threaded to engage threads 30 formed in the block portion of aperture 31. Upper terminal 24 of active element 22 is in electrical contact with strip 12 as by screwing pedestal 28 into the threaded portion 30 of aperture 31 pressing the terminal 24 against the strip 12. Thus, the upper terminal 24 is in conductive contact with strip 12 and lower terminal 26 is in conductive contact with block 20 for electrical connection to ground and for heat dissipation.

To apply a bias to activate active element 22, a bias port 32 is provided, the center conductor of which is electrically attached to strip 12 by lead 34 and the shell of which is attached to the copper block 20. The bias may be of pulsed or d.c. form depending upon the active element and the mode of operation desired. In the present embodiment being described, a pulsed source is used for the bias of the diode 22. The RF power output generated by device 10 is transmitted through coaxial RF output connector 38 being electrically connected to strip 12 by lead 40.

Extending from active element 22 is an open-ended resonant strip section 36 of the microstrip transmission line. The length of resonant section 36 is predetermined and fixed at a selected dimension which is proportional to $\lambda$, the wavelength of oscillator operation. Device 10 will thereby oscillate at a frequency which is dependent upon the length of resonant section 36. In a typical circuit, for example, resonant section 36 may be formed to be substantially equal to $3\lambda/4$ with device 10 operating at an oscillator frequency of about 10 GHz.

The pulsed bias supplied to device 10 through bias port 32 is provided by a source, not shown, and coupled to active element 22 by lead 34 and the resonant section 36 portion of strip 12. By applying the appropriate pulsed bias at bias port 32, active element 22 oscillates and microwave signals are coupled along strip 12 in the direction of coaxial RF output connector 38. These signals are RF signals produced at microwave frequencies which are isolated from the bias by inserting blocking capacitor 78 in the strip 12 at output connector 38. The pulsed bias is thus blocked from output connector 38 and the RF signal is passed through output connector 38 as the output of device 10. Although, as previously indicated, a pulsed bias is applied to active element 22 to obtain certain performance results, a d.c. bias may be applied to active element 22 to obtain different oscillator characteristics for various other oscillator applications.

The RF operating characteristics of device 10 at a certain frequency at which it operates are dependent upon the values of the components comprising the circuit of device 10 described above as well as the bias applied to active element 22. Since the allowable tolerance variations in these component values affect the circuit performance, resulting in deviations from desired performance levels, a moveable plate 42 is provided to mechanically finely adjust the operating characteristics to within specified limits. Plate 42 provides a capacitive reactance in strip 12 which adjusts the circuit impedance to achieve high oscillator output efficiency as well as the operating characteristics described previously, which include: (1) the RF output power of the oscillator; (2) the bias power to RF power conversion efficiency; (3) the signal-to-noise ratio of the RF output signal; and (4) the quality of the RF spectrum of the output power as compared with the ideal pulsed RF spectrum.

Device 10 will operate as an oscillator at its adjusted condition at a particular preselected frequency. Since oscillators of this type are often utilized in electronic systems in which a range of operational frequencies is required, it is necessary that the oscillator frequency be tunable to adjust to any frequency within that specific operating range for the proper and desired performance. As explained above in the discussion of the prior art, many amplifying circuits, including oscillator circuits, employ varactors integral with the oscillator circuit to electrically tune the oscillator frequency by varying the varactor capacitance. However, since such varactor tuning arrangements are an integral part of the oscillator circuit, any change in frequency effected by varying the bias of the varactor also disadvantageously alters the operating characteristics of the device 10.

This problem is overcome in accordance with the present invention by providing a tuning means that functions independently of the amplifying or oscillating circuit and then operates to achieve tuning without substantially affecting the operating characteristics of the device. As illustrated in FIGS. 1 and 2, a varactor circuit 44 is RF coupled to the strip 12 preferably in the region of resonant section 36 to frequency tune device 10 as will be described.

Figure 3:
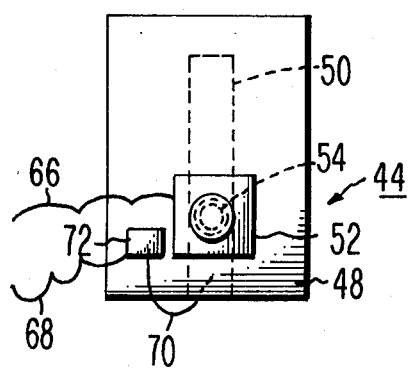
FIG. 3 is a plan view of the varactor tuning circuit.
Figure 4:
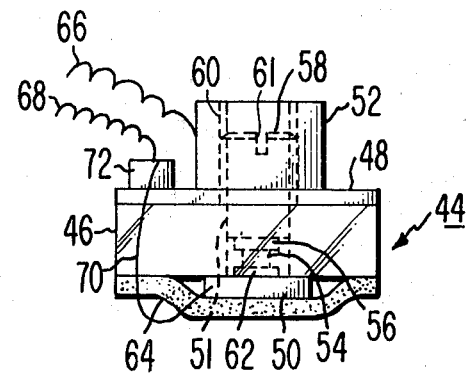
FIG. 4 is a frontal elevation view of the varactor tuning circuit.

Referring to FIGS. 3 and 4, varactor circuit 44 is shown in a microstrip transmission line configuration comprising a dielectric substrate 46, preferably formed of Teflon-fiberglass material, substrate 46 having a conductive ground plane 48 covering one broad surface and a resonant narrow conductive strip 50 on the opposite surface. It should be noted that ground plane 48 is not electrically connected to ground plane 16 of device 10 in the preferred embodiment herein described. The length of varactor circuit resonant strip 50 is proportional to wavelength, λ, which corresponds to the operating frequency of device 10. With the device 10 operating as an oscillator at approximately 10 GHz it is preferable that the varactor circuit resonant strip 50 be substantially equal to λ/2. In a preferred varactor circuit mounting arrangement, varactor substrate aperture 51 is formed through ground plane 48 and substrate 46, aperture 51 being in register with resonant strip 50 to receive a voltage variable capacitor (varactor) 54, varactor 54 having a ground terminal 56 and a circuit terminal 62. Conductively attached to ground plane 48 is a metallic varactor housing 52 for supporting varactor 54, varactor housing 52 having a threaded aperture 60 formed in register with substrate aperture 51. Ground terminal 56 is conductively affixed to an electrically and thermally conductive varactor mounting support 58, support 58 having threads to engage the threads of housing aperture 60. Support 58 is screwed into housing 52 as by support slot 61 such that circuit terminal 62 contacts resonant strip 50 to thereby establish an electrically conductive path between circuit terminal 62 and resonant strip 50. Support 58 is sufficiently tightened in housing 52 to assure good electrical contact of circuit terminal 62 to resonant strip 50 without breaking or distorting resonant strip 50 and to establish thereby a good conductive path from varactor ground terminal 56 to ground plane 48. Suitable bias voltage for varactor circuit 44 is provided in a convenient manner.

Varactor resonant strip 50 is suitably covered with insulating material 64. As shown in FIG. 4, insulating material 64 may cover the entire area of the narrow strip surface of substrate 46 for ease of application although it is only necessary to cover the surface of resonant strip 50.

Varactor circuit 44 is positioned on strip 12 of device 10, preferably in the region of resonant section 36 such that the varactor resonant strip 50 portion of varactor circuit 44 is RF coupled to strip 12, the insulating material 64 being therebetween the two independent circuits serving as a dielectric coupling medium. Insulating material 64, thus effectively electrically insulates the separate circuits such that varactor circuit 44 is not directly contacting strip 12. The properties of insulating material 64, in particular its thickness and dielectric constant, provide a dielectric path for varactor circuit 44 to be RF coupled to strip 12 rather than being connected directly to or formed integrally with the oscillator circuit portion of the device 10. It has been found that the thickness of the insulating material 64 is to be less than one wavelength for the operating frequency of device 10 to achieve RF coupling of varactor circuit 44 to strip 12. Preferably, insulating material 64 is formed of polytetrafluoroethylene, sold under the Trademark of Teflon, having a dielectric constant of about 2.0 and a thickness of approximately 0.003 inch. The Teflon tape is suitably self-adhesive for advantageous application to resonant strip 50 and substrate 46.

By RF coupling varactor circuit 44 to strip 12, device 10 is rendered frequency tunable about its pretuned frequency by simply varying the varactor capacitance in varactor circuit 44 regardless of the position of varactor circuit 44 on strip 12. However, the degree of tunability is varied depending upon the location of varactor circuit 44 on strip 12. It has been determined that by RF coupling varactor circuit 44 to strip 12 preferably in the region of resonant section 36 the range of tunability is the maximum. By coupling varactor circuit 44 in the preferred region of resonant section 36, changes in varactor capacitance have a greater influence on the resonant properties and thus the operating frequency of the oscillator circuit of device 10. It has also been found that by achieving good RF coupling of varactor circuit 44 to strip 12 in the region of resonant section 36, the operating characteristics which are both pretuned and preadjusted for device performance are substantially unaffected. Good RF coupling is achieved by obtaining maximum tuning range and maintenance of operating characteristics over that tuning range. The location at which good RF coupling occurs is empirically determined. As shown in FIG. 1, the orientation to achieve good RF coupling may be selected in the transverse directions with respect to strip 12 as indicated by the arrows as well as being skewed thereto. The varactor circuit 44 is then suitably fixed to device 10 subsequent to achieving the desired coupling. Having achieved good RF coupling, changes in the varactor capacitance of varactor circuit 44 to frequency tune device 10 will not result in any substantially degradation of the operating characteristics of device 10 over the tuning range.

By varying the varactor capacitance of varactor circuit 44 which is RF coupled to strip 12, a reactance change is introduced into the microstrip transmission line thereby changing the resonance of the oscillating circuit of device 10 and thus its frequency. It will be understood that the type of reactance reflected through the RF coupling to the device will depend on the particular circuit configurations used as well as the operating conditions. Thus, either a capacitive or inductive reactance change may be effected as desired by varying the varactor bias. Therefore, no mechanical means is required to tune device 10, only the application of varactor bias is required.

Subsequent to empirically achieving a location at which varactor circuit 44 is desirably RF coupled to strip 12, varactor circuit 44 is secured to device 10 to maintain the selected location of varactor circuit 44. Preferably, varactor circuit 44 is secured by plate 74 extending parallel to ground plane 48 of varactor circuit 44, a portion of plate 74 overlapping a border section of ground plane 48 of varactor circuit 44 and a portion extending over device 10. Screw means 76 is provided to attach plate 74 to device 10 such that varactor circuit 44 is effectively clamped between plate 74 and device 10 on substrate 14. Since plate 74 may be in electrical contact with ground plane 48, it is required in the preferred varactor circuit securing arrangement that plate 74 be made of non-metallic material so as to maintain varactor circuit 44 independent electrically from device 10 except by the RF coupling.

The capacitance of varactor 54 is varied by changing the varactor bias voltage, which is applied from an external source not shown. In a suitable arrangement for applying the varactor bias to varactor circuit 44, a varactor ground lead 66 is attached to metallic housing 52, which is conductively affixed to ground plane 48 and varactor ground terminal 56 as previously described. Thus, ground lead 66 is conductively connected to varactor ground terminal 56. A varactor bias lead 68 is affixed to resonant strip 50 which is connected to varactor circuit terminal 62. To electrically vary the capacitance of varactor 54, a bias voltage is applied to bias leads 68 and 66. A variable d.c. voltage supply is used to provide the varactor bias voltage in the preferred embodiment of the invention although a time-varying voltage may also be used.

An arrangement for providing an RF bypass to isolate the RF signal in varactor circuit 44 from the bias source is achieved preferably by adding a shunting capacitor 72 and a high inductance lead 70 to varactor circuit 44. High inductance lead 70 is interposed between varactor bias lead 68 and resonant strip 50 and shunting capacitor 72 is interposed between bias lead 68 and ground plane 48. High inductance lead 70 and shunting capacitor 72 form an RF bypass circuit by which the RF signal is blocked from passing out through the bias lead 68 and ground lead 66 restricting the RF signal to the resonant microstrip circuit line 50 and varactor 54.

Figure 5:
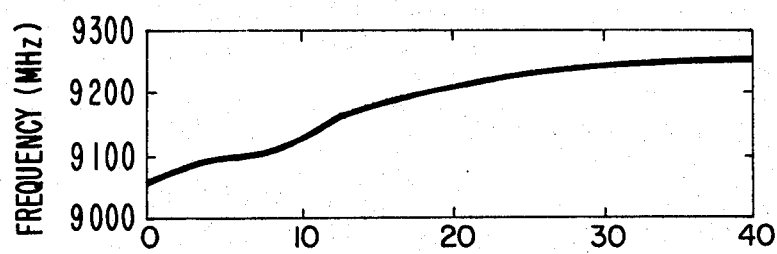
FIGS. 5 and 6 are curves indicating various operational characteristics of an oscillator device utilizing the tuning circuit.
Figure 6:
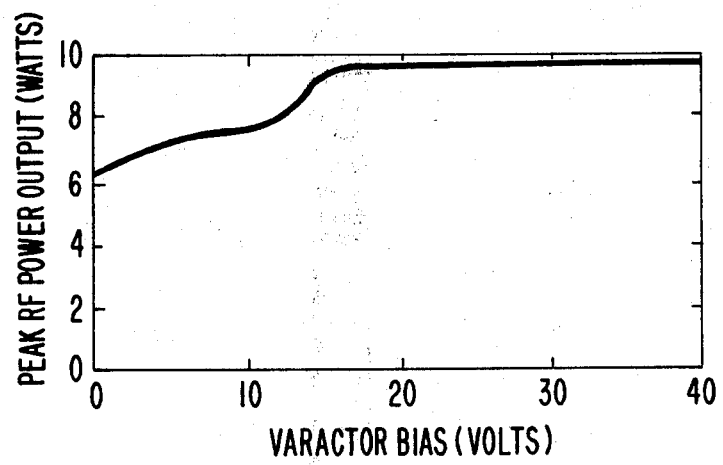

Performance measurements taken of an oscillator having a pulsed bias avalanche diode utilizing a preferred embodiment of the varactor tuning apparatus as herein described are graphically shown in FIGS. 5 and 6. The tuning range is from 9050 MHz to 9250 MHz while the RF power varies from 6.2 to 9.7 watts for pulsed bias at 114 volts and 3.7 amperes with a 0.5 microsecond pulsewidth and a pulse repetition rate of 20 kilohertz.

Thus, in accordance with the preferred form of the present invention, it will now be appreciated that there is provided improved means for tuning a strip transmission line oscillator at frequencies above and below a fixed preadjusted frequency of the oscillating circuit by RF coupling a varactor circuit whose capacitance is adjustable electrically by varying the bias of the varactor. The varactor tuning circuit is RF coupled to the strip transmission line of the oscillating circuit preferably in the region of the circuit containing the resonant section of the strip transmission line. The varactor tuning circuit may be oriented to many different positions which positions include being parallel or perpendicular as well as being skewed to the strip transmission line.

Further, it will be appreciated that according to the present invention the environment for effecting the RF coupling at the tuning means must provide suitable structure to allow for accessibility of the interfacing components. Thus, it will be apparent in view of the embodiment described that any of the strip transmission lines known in the art as described more fully above will be useful in the practice of this invention.

It will also be appreciated that the varactor bias voltage may be produced by a time-varying voltage source as explained above. Thus, the varactor tuning apparatus may be used to produce frequency modulation of the device's output RF signal at large modulation rates. Alternatively, the varactor tuning apparatus may be used to change rapidly the device's output frequency to a new frequency.

It will be appreciated by those skilled in the art that the present invention may be utilized as a tuning means for an amplifier formed of an active solid-state element and a strip transmission line circuit. Thus, as is well known in the art, by suitably coupling an RF input signal to the strip transmission line of the device described above, the device is made to operate as an amplifier whereby the active element reflects the input signal as an amplified RF output signal. Such an amplifier may be arranged to operate at a desired power gain and phase shift at a selected frequency. The varactor circuit described above in the description of the embodiment of the oscillator is RF coupled to the amplifier with a preset amount of coupling such that phase shift changes of the amplified RF signal may be effected by varying the varactor bias of the varactor circuit. The varactor tuning apparatus provides thereby a means for the amplifier to produce phase modulation in the output RF signal by varying the bias signal as a function of the modulating signal. Further, an amplifier operating at a substantially constant phase shift and power gain may have its frequency band of operation changed by varying the bias of the varactor with a suitable preset adjustment of the amount of RF coupling. Thus, a frequency adjustable amplifier may be formed by varying the bias of the varactor as a function of the desired frequency adjustment. However it should be noted, to effect such changes in frequency band, it is required to RF couple the varactor circuit in the region of the resonant section of the strip transmission line of the device.

What is claimed is:

1. In a negative-resistance radio frequency device of the type wherein an active solid-state element is included in a strip transmission line, said strip transmission line having a resonant conductive strip section, said device having predetermined operating characteristics wherein the improvement comprises a separate varactor circuit for tuning said device, said varactor circuit including means to indirectly couple said varactor circuit to said strip transmission line, and a varactor mounted on a dielectric substrate, said dielectric substrate having a ground plane and a resonant conductive strip, means, including said indirectly coupled means, for RF coupling said varactor circuit to said strip transmission line of said device, and means for tuning said device by electrically varying the capacitance of said varactor and varying thereby the reactance of said strip transmission line of said device.

2. A device according to claim 1, wherein said device is adapted to operate as an oscillator, said active element being arranged to operate at a given frequency, said tuning means varying the frequency of said oscillator by varying the reactance of said strip transmission line of said device.

3. A device according to claim 1, wherein said strip transmission line is a microstrip transmission line.

4. A device according to claim 1, wherein said active element is an avalanche diode.

5. A device according to claim 1, wherein said active element is a transferred electron device (TED).

6. A device according to claim 1, wherein said active element is biased by a pulsed source.

7. A device according to claim 1, wherein said active element is biased by a d.c. source.

8. A device according to claim 1, wherein said varactor circuit is RF coupled to said strip transmission line in the region of said resonant section of said strip transmission line to achieve RF coupling whereby said operating characteristics of said device are substantially unaffected and whereby said device has a range of tunability over which range said operating characteristics are substantially unaltered by changes in said reactance of said strip transmission line effected by said tuning means.

9. A device according to claim 1, wherein said varactor circuit further comprises a high inductance lead and a shunting capacitor arranged to provide an RF bypass circuit to isolate an RF signal in said varactor circuit from said tuning means for varying said varactor capacitance.

10. A device according to claim 1, wherein said tuning means comprises a bias voltage applied to said varactor to change the capacitance of said varactor.

11. A device according to claim 10, wherein said bias voltage is supplied by a variable d.c. voltage source.

12. A device according to claim 10, wherein said bias voltage is applied by a time-varying voltage source.

13. A device according to claim 1, wherein said RF coupling means includes insulating means covering said varactor circuit resonant conductive strip, said insulating means being of thickness less than a wavelength for the operating frequency of the device.

14. A device according to claim 13, wherein said insulating means is self-adhesive tape, formed of polytetrafluoroethylene.

15. A device according to claim 1, further including means to couple an RF input signal to said device such that said device operates as an amplifier, said amplifier being arranged to have a given power gain and phase shift at a selected frequency, said device further including means for adjusting the RF coupling between said varactor circuit and said strip transmission line whereby changes in said phase shift are effected by variations in the reactance of said strip transmission line by said tuning means.

16. A device according to claim 1, further including means to couple an RF input signal to said device such that said device operates as an amplifier, said amplifier being arranged to have a given power gain and phase shift over a frequency band, wherein said varactor circuit is RF coupled in the region of said resonant section of said strip transmission line, said device further including means for adjusting the RF coupling between said varactor circuit and said resonant section whereby changes in said frequency band are effected by variations in the reactance of said strip transmission line by said tuning means.

17. A device according to claim 1, wherein said RF coupling means includes means for adjustably positioning said varactor circuit on said strip transmission line for selectively locating a position of desired RF coupling.

* * * * *